United States Patent
Chang et al.

(10) Patent No.: US 9,614,053 B2
(45) Date of Patent: Apr. 4, 2017

(54) SPACERS WITH RECTANGULAR PROFILE AND METHODS OF FORMING THE SAME

(71) Applicant: Taiwan Semiconductor Manufacturing Company, Ltd., Hsin-Chu (TW)

(72) Inventors: Yu-Sheng Chang, Taipei (TW); Chung-Ju Lee, Hsinchu (TW); Tien-I Bao, Dayuan Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/097,579

(22) Filed: Dec. 5, 2013

(65) Prior Publication Data

US 2015/0162416 A1 Jun. 11, 2015

(51) Int. Cl.
| | | |
|---|---|---|
| *H01L 29/00* | (2006.01) | |
| *H01L 29/66* | (2006.01) | |
| *H01L 29/78* | (2006.01) | |
| *H01L 21/8234* | (2006.01) | |
| *H01L 21/033* | (2006.01) | |
| *H01L 21/308* | (2006.01) | |
| *H01L 21/311* | (2006.01) | |

(52) U.S. Cl.
CPC ...... *H01L 29/6656* (2013.01); *H01L 21/0337* (2013.01); *H01L 21/3086* (2013.01); *H01L 21/31144* (2013.01); *H01L 21/823425* (2013.01); *H01L 21/823468* (2013.01); *H01L 29/78* (2013.01)

(58) Field of Classification Search
CPC ..... H01L 21/823468; H01L 21/823864; H01L 21/28123; H01L 29/6653; H01L 29/66553; H01L 29/6656; H01L 29/66636; H01L 21/0214; H01L 21/0337; H01L 21/0338; H01L 21/3086; H01L 21/3088
See application file for complete search history.

(56) References Cited

U.S. PATENT DOCUMENTS

| | | | | |
|---|---|---|---|---|
| 5,795,830 | A * | 8/1998 | Cronin | H01L 21/0338 257/E21.036 |
| 6,518,137 | B2 * | 2/2003 | Hsieh | H01L 29/665 257/E21.257 |
| 6,887,759 | B2 * | 5/2005 | Guyader | H01L 21/28247 257/E21.285 |

(Continued)

OTHER PUBLICATIONS

Quirk & Serda, "Semiconductor Manufacturing Technology" p. 439. Published by Prentice-Hall Inc. in 2001.*

(Continued)

*Primary Examiner* — Jesse Y Miyoshi
*Assistant Examiner* — Tuan A Hoang
(74) *Attorney, Agent, or Firm* — Slater Matsil, LLP

(57) ABSTRACT

A method includes forming a spacer layer on a top surface and sidewalls of a patterned feature, wherein the patterned feature is overlying a base layer. A protection layer is formed to contact a top surface and a sidewall surface of the spacer layer. The horizontal portions of the protection layer are removed, wherein vertical portions of the protect layer remain after the removal. The spacer layer is etched to remove horizontal portions of the spacer layer, wherein vertical portions of the spacer layer remain to form parts of spacers.

13 Claims, 8 Drawing Sheets

(56) References Cited

U.S. PATENT DOCUMENTS

| | | | |
|---|---|---|---|
| 7,259,105 B2* | 8/2007 | Kim | 438/724 |
| 2005/0148133 A1* | 7/2005 | Chen | H01L 21/823807 438/199 |
| 2006/0046399 A1 | 3/2006 | Lindert et al. | |
| 2011/0254093 A1* | 10/2011 | Wang | H01L 21/823857 257/368 |
| 2012/0077350 A1* | 3/2012 | Miya | C23C 16/345 438/765 |
| 2012/0329259 A1* | 12/2012 | Lu | H01L 29/66545 438/586 |
| 2013/0001706 A1* | 1/2013 | Haran | H01L 29/66545 257/410 |
| 2013/0064012 A1* | 3/2013 | Kawasaki | H01L 21/823468 365/182 |
| 2013/0087527 A1* | 4/2013 | Pain | B82Y 10/00 216/18 |
| 2013/0244437 A1* | 9/2013 | Flachowsky | H01L 21/3086 438/703 |
| 2013/0307033 A1* | 11/2013 | Kanakasabapathy et al. | 257/288 |
| 2014/0035010 A1* | 2/2014 | Cai | H01L 29/6653 257/288 |
| 2014/0159168 A1* | 6/2014 | Toh | H01L 29/66545 257/410 |

OTHER PUBLICATIONS

Quirk-Serda "Semiconductor Manufacturing Technology", p. 439. Published by Prentice-Hall, Inc. in 2001.*

* cited by examiner

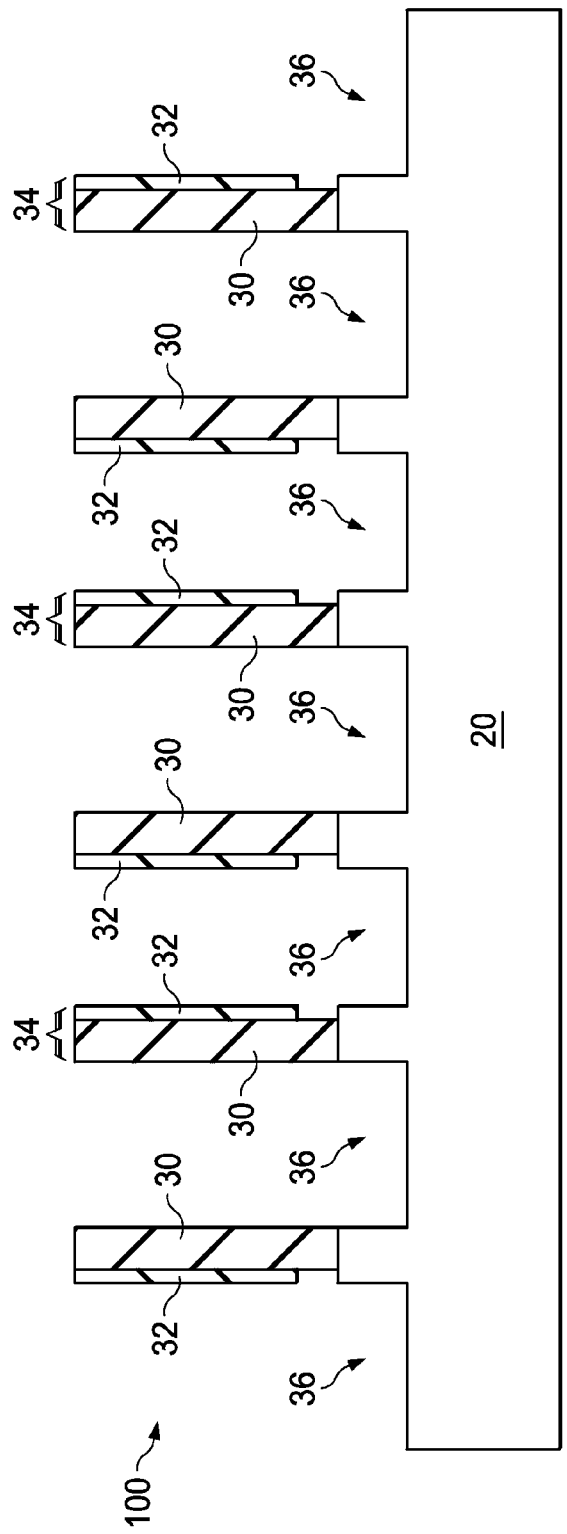
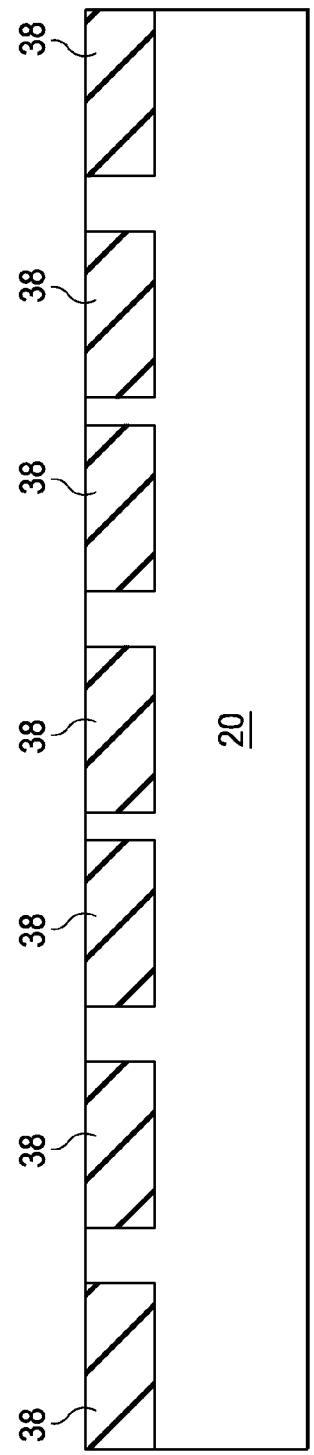

SPACERS WITH RECTANGULAR PROFILE AND METHODS OF FORMING THE SAME

BACKGROUND

Spacers are common features used in the manufacturing of integrated circuits, and are used in both the front end of line processes, which include the formation of transistors, and back end of line processes, which include the formation of the metal connections to connect the transistors. For example, transistors often have gate spacers that are on the gate electrodes of the transistors. The gate spacers electrically insulate the gate electrodes from other conductive features. Furthermore, the gate spacers are used to define the locations of source and drain regions of the transistors.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 1 through 8 are cross-sectional views of intermediate stages in the manufacturing of an integrated circuit structure in accordance with some exemplary embodiments, wherein spacers with rectangular profiles are formed.

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

An integrated circuit structure with rectangular spacers and the method of forming the same are provided in accordance with various exemplary embodiments. The intermediate stages of forming the integrated circuit structures are illustrated. The variations of the embodiments are discussed. Throughout the various views and illustrative embodiments, like reference numbers are used to designate like elements.

Figure 1:
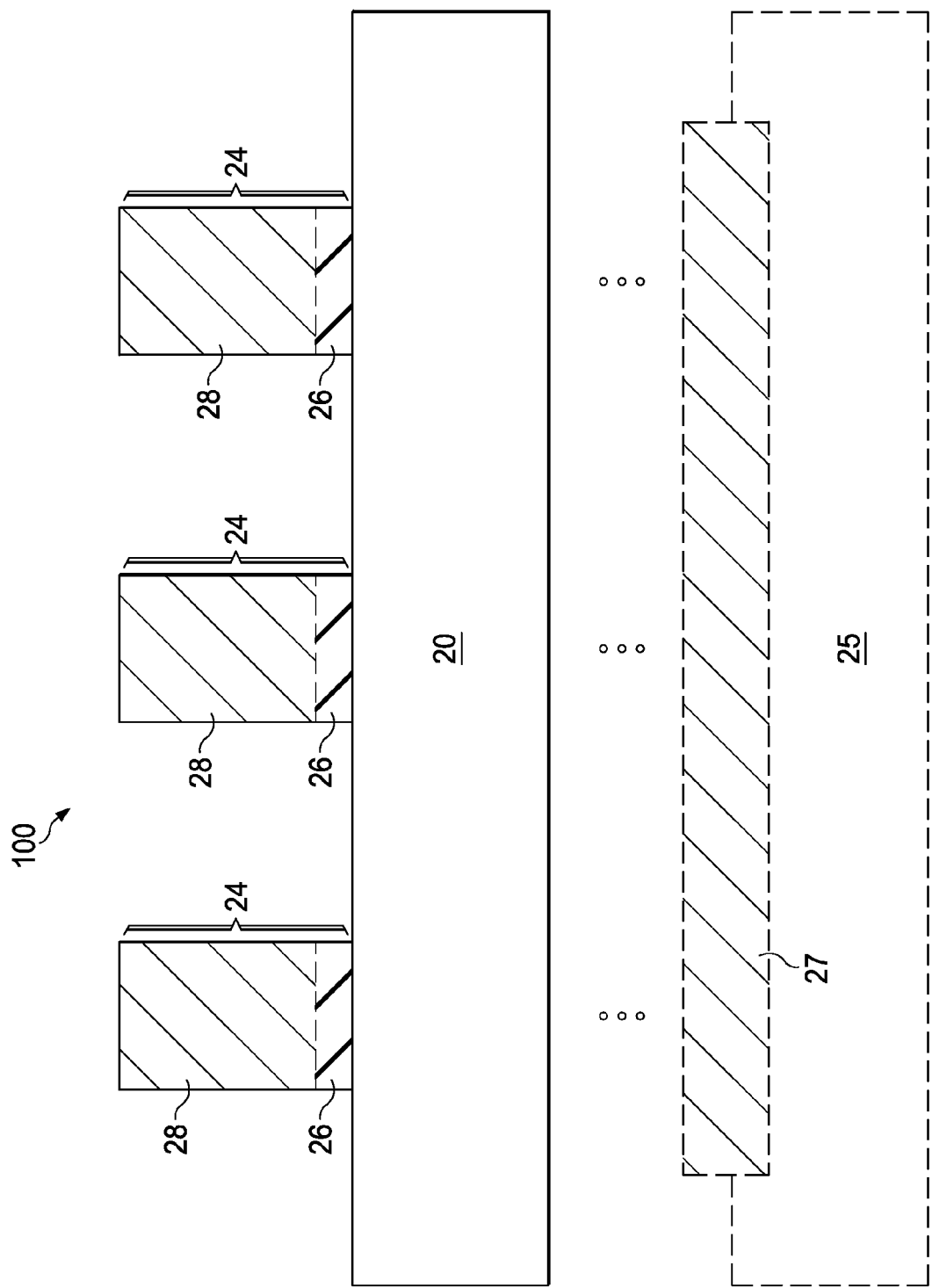

FIG. 1 illustrates a portion of wafer 100, which includes base layer 20 and patterned features 24 over base layer 20. In some exemplary embodiments, base layer 20 is a dielectric layer. For example, base layer 20 may comprise a low-k dielectric material having a k value lower than about 3.0, which low-k dielectric material may contain carbon, and may have pores therein. In these embodiments, base layer 20 may be resided over semiconductor substrate 25, which may be a silicon substrate, a silicon carbon substrate, a III-V compound semiconductor substrate, or the like. Integrated circuit devices 27 (such as transistors) may be formed at the top surface of semiconductor substrate 25. Patterned features 24 may be dielectric patterns in these embodiments. For example, patterned features 24 may be formed of an oxide, a nitride, or the like. Alternatively, patterned features 24 are formed of amorphous silicon. The formation of patterned features 24 may include forming a blanket layer over base layer 20, and then patterning the blanket layer. Patterned features 24 may have substantially vertical sidewalls.

In alternative embodiments, base layer 20 is a semiconductor substrate, which may be a silicon substrate, a silicon carbon substrate, a III-V compound semiconductor substrate, or the like. In these embodiments, patterned features 24 may be gate stacks of transistors. For example, patterned features 24 may include gate dielectrics 26 and gate electrodes 28 over gate dielectrics 26.

Figure 2:
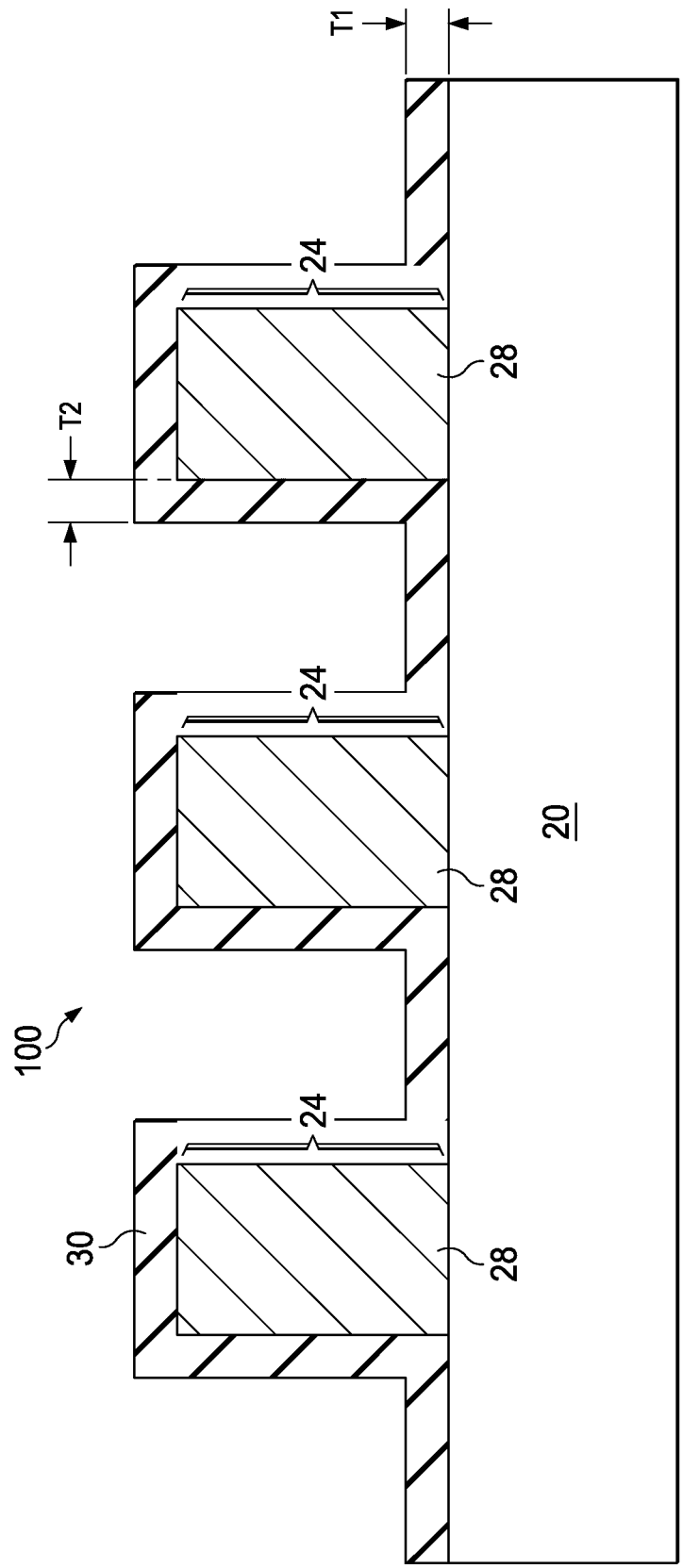

Referring to FIG. 2, spacer layer 30 is formed over the top surfaces and on the sidewalls of patterned features 24. In some embodiments, spacer layer 30 is formed of a dielectric material or metal spacer, which may be an oxide (such as silicon oxide and titanium oxide), a nitride (such as silicon nitride and titanium nitride), or other dielectric materials. Spacer layer 30 may have a homogeneous structure, and hence the entire spacer layer 30, from top to bottom, is formed of the same material. Spacer layer 30 may be formed using a deposition method that is configured to form a conformal layer, which deposition method may be selected from Atomic Layer Deposition (ALD), Chemical Vapor Deposition (CVD), Metal Organic Chemical Vapor Deposition (MOCVD), or the like. The resulting spacer layer 30 hence may be conformal. For example, thickness T1 of the vertical portions is close to thickness T2 of the horizontal portions, with the absolute value of the difference between T1 and T2 being smaller than about 25% percent of both T1 and T2. In some exemplary embodiments, thicknesses T1 and T2 are in the range between about 5 nm and about 500 nm. It is appreciated, however, that the values recited throughout the description are merely examples, and may be changed to different values.

Figure 3:
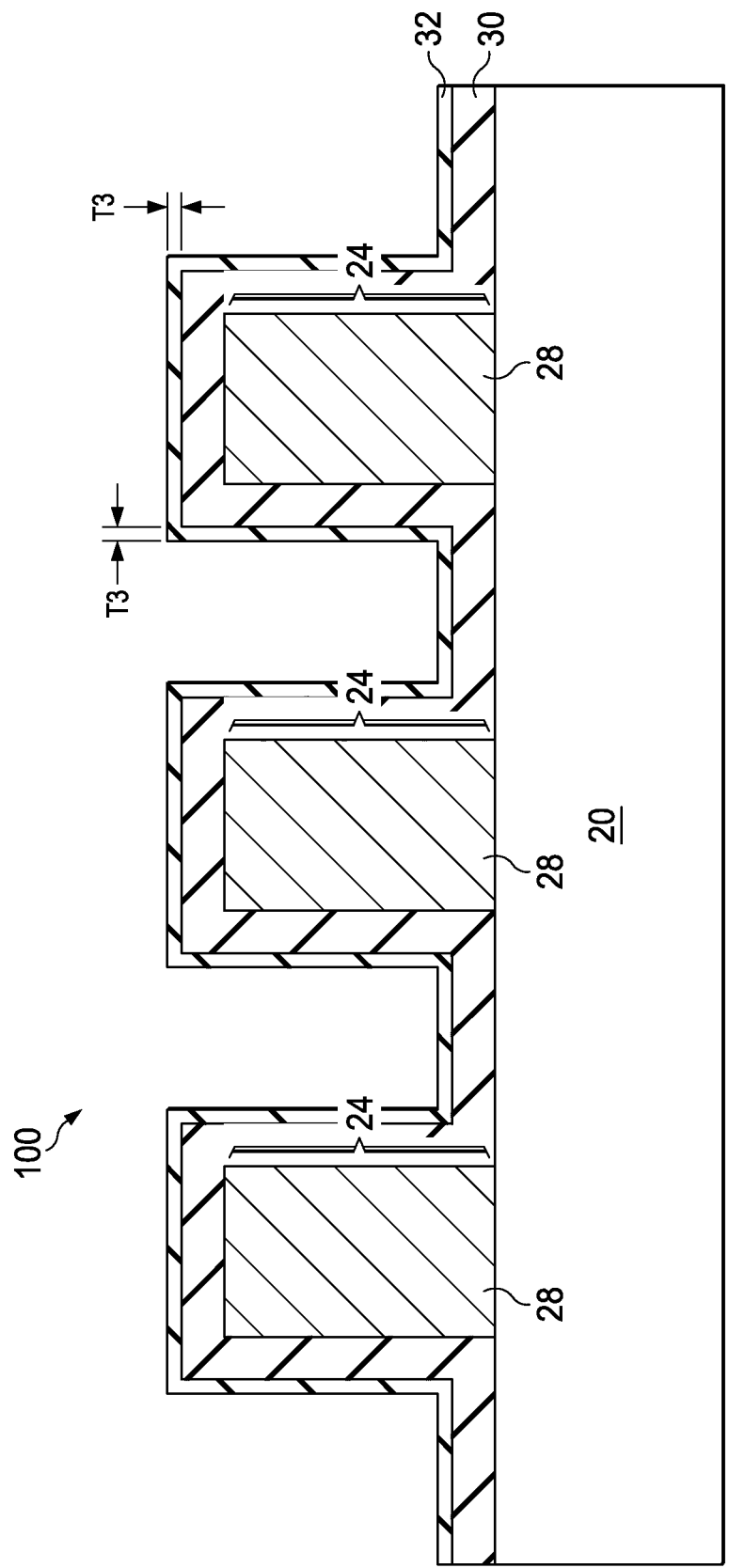

FIG. 3 illustrates the formation of protection layer 32, which forms a blanket layer on the vertical portions and the horizontal portions of spacer layer 30. Protection layer 32 comprises a material different from the material of spacer layer 30. For example, in the embodiments wherein spacer layer 30 is an oxide layer, protection layer may be a nitride-containing layer, and may further include oxygen, or may be free from oxygen. In the embodiments wherein spacer layer 30 is a nitride layer, protection layer may be an oxide-containing layer, and may further include nitrogen, or may be free from nitrogen. The difference between protection layer 32 and the underlying oxide layer 30 is significant enough, so that in subsequent etching processes, appropriate etchants can be selected to attack one of protection layer 32 and the underlying oxide layer 30, but not the other.

Protection layer 32 is formed as a conformal layer, so that the vertical portions and the horizontal portions of protection layer 32 have similar thicknesses. In some embodiments, thickness T3 of protection layer 32 is in the range between about 5Å and about 50Å, although greater or smaller thicknesses may be used.

In some exemplary embodiments, protection layer 32 is formed in a process chamber or a furnace, in which a process gas is provided. The process gas may be selected from nitrogen ($N_2$), oxygen ($O_2$), a combined gas of $CH_4$ and nitrogen ($N_2$), $CH_2F_2$, or the like, depending on the material of spacer layer 30 and the desirable material of protection layer 32.

The formation of protection layer 32 may include reacting a surface layer of spacer layer 30 with a process gas, so that the surface layer is converted to protection layer 32. For example, when spacer layer 30 comprises an oxide (which may be nitrogen free) such as silicon oxide, a nitrogen-containing gas such as $N_2$ may be used to perform a nitridation to convert a surface layer of spacer layer 30 to a nitrogen-containing layer. The resulting protection layer 32 includes a nitride of the material of spacer layer 30. For example, protection layer 32 includes silicon oxynitride in some exemplary embodiments. In these embodiments, spacer layer 30 has a silicon-to-oxygen ratio, which is the ratio of the silicon atoms to the number of oxygen atoms, the same as the silicon-to-oxygen ratio in protection layer 32.

When spacer layer 30 comprises a nitride such as silicon nitride (which may be oxygen free), an oxygen-containing gas such as $O_2$ may be used to perform an oxidation to convert a surface layer of spacer layer 30 to an oxide. The resulting protection layer 32 includes an oxide of the material of spacer layer 30. For example, protection layer 32 includes silicon oxynitride in some exemplary embodiments. In these embodiments, spacer layer 30 has a silicon-to-nitrogen ratio, which is the ratio of the silicon atoms to the number of nitrogen atoms, the same as the silicon-to-nitrogen ratio in protection layer 32. In the embodiments in which protection layer 32 is formed through reaction, the thickness of protection layer 32 is uniform, with the Vertical portions and the horizontal portions having the same thickness T3.

The formation of protection layer 32 may be achieved through a deposition process. For example, when the combined gas of $CH_4$ and $N_2$ is used, the resulting protection layer 32 may be a carbon and nitrogen (CN) containing layer, which is deposited on the spacer layer 30 in FIG. 2. The CN-containing layer may be a polymer layer. In some other exemplary embodiments in which $CH_2F_2$ is used as the process gas, the resulting protection layer 32 may be a carbon and fluorine (CF) containing polymer layer, which is deposited on the spacer layer 30 in FIG. 2.

In an exemplary process, in the formation of protection layer 32, wafer 100 may be heated or not heated. For example, the formation of protection layer 32 may be performed at a temperature in the range between about 10° C. and about 500° C. During the formation, plasma may be (or may not be) turned on. When plasma is turned on, the power may be in the range between about 10 watts and about 2,000 watts. There is no bias voltage or substantially no bias voltage applied, so that wafer 100 is not bombarded. When the formation of protection layer 32 is formed in a process chamber, the pressure of the process chamber may be between about 0.1 mtorr and about 50 mtorr. The flow rate of the process gas may be between about 1 sccm and about 2,000 sccm.

Figure 4:
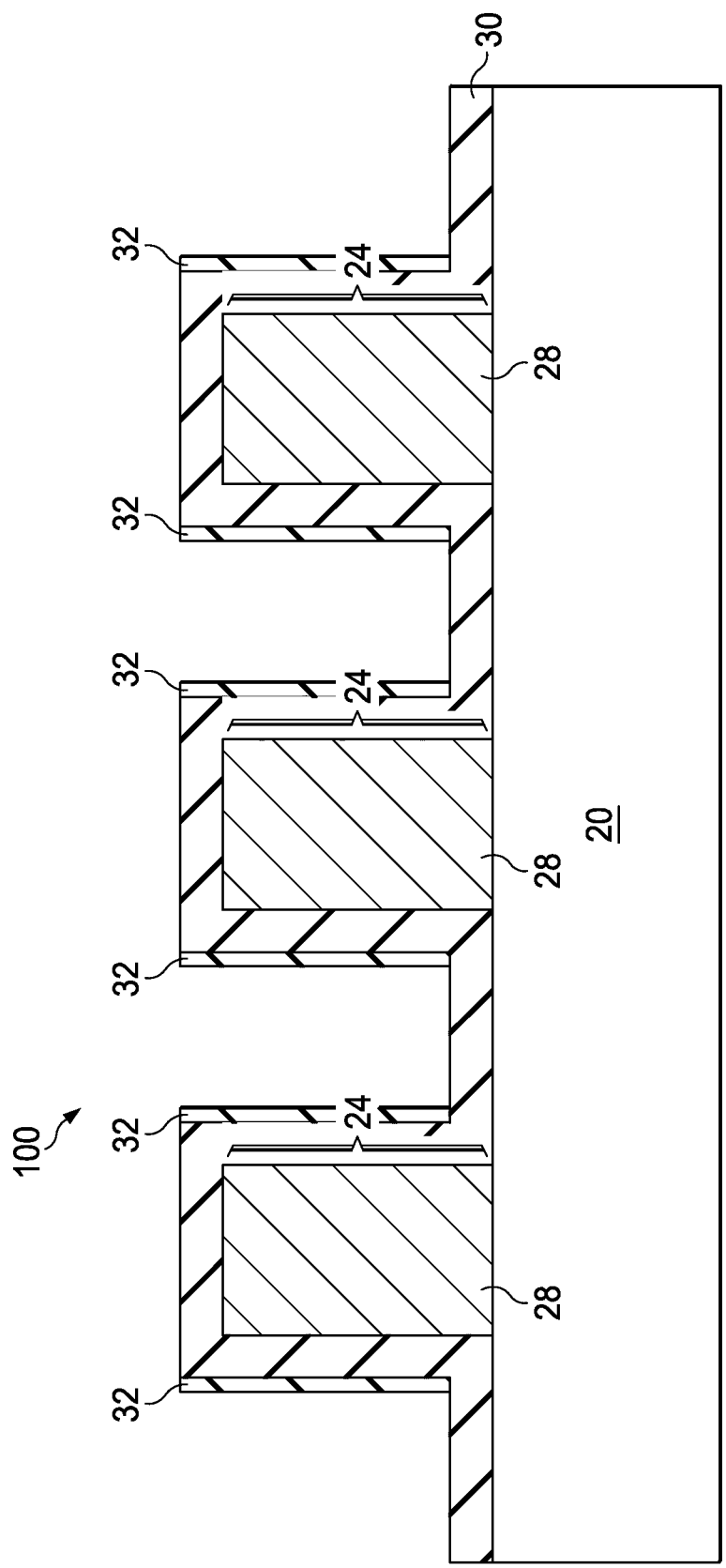

Referring to FIG. 4, after the formation of protection layer 32, an anisotropic etching is performed to remove the horizontal portions of protection layer 32, while the vertical portions of protection layer 32 remain not etched. Spacer layer 30 is also not etched. The etching may be a dry etching, and the etchant gas is selected, so that the etching selectivity (referred to a as a first etching selectivity hereinafter) of protection layer 32 and spacer layer 30 is high, wherein the first etching selectivity is the ratio of the etching rate of protection layer 32 to the etching rate of spacer layer 30. For example, the first etching selectivity may be higher than about 4. In the embodiments wherein spacer layer 30 comprises an oxide, while protection layer 32 comprises a nitride, the etchant gas may include $CF_4$, $Cl_2$, $CH_4$, $N_2$, $O_2$, $H_2$, $C_xF_y$, or combinations thereof. In the embodiments wherein spacer layer 30 comprises a nitride, while protection layer 32 comprises an oxide, the etchant gas may also include $CF_4$, $Cl_2$, $CH_4$, $N_2$, $O_2$, $H_2$, $C_xF_y$, or combinations thereof. In the embodiments wherein protection layer 32 comprises a CN-containing polymer, the etchant gas may include $CF_4$, $Cl_2$, $CH_4$, $N_2$, $O_2$, $H_2$, $C_xF_y$, or combinations thereof. In the embodiments wherein spacer layer 30 comprises a CF-containing polymer, the etchant gas may include $CF_4$, $Cl_2$, $CH_4$, $N_2$, $O_2$, $H_2$, $C_xF_y$, or combinations thereof. The etching selectivity may be adjusted by tuning the flow rate ratio of the chemistry used.

Figure 5:
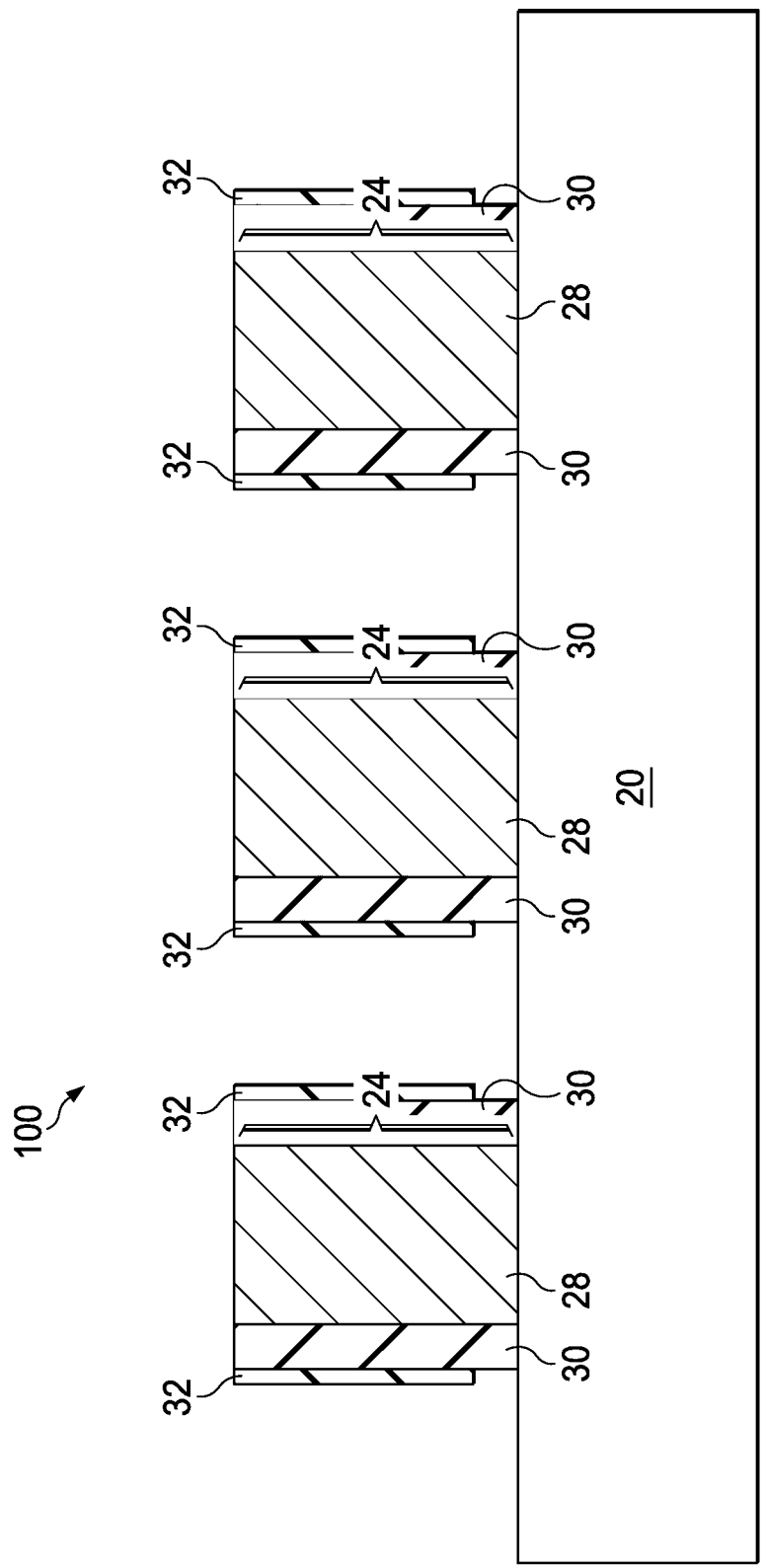

After the etching of protection layer 32, spacer layer 30 is patterned. Referring to FIG. 5, the resulting remaining portions of spacer layer 30 and protection layer 32 are referred to as spacers 34 hereinafter. In some embodiments, the etching is performed using an etchant different from the etchant used in the step shown in FIG. 4, which is to etch protection layer 32. The etching may also be an anisotropic etching (with isotropic effect included or not included). In the patterning of spacer layer 30, the horizontal portions of spacer layer 30 are removed, while the vertical portions of spacer layer 30 remain not etched. The etching may be a dry etching, and the etchant gas is selected, so that the etching selectivity (referred to a as a second etching selectivity hereinafter) of spacer layer 30 and protection layer 32 is high, wherein the second etching selectivity is the ratio of the etching rate of spacer layer 30 to the etching rate of protection layer 32. For example, the second etching selectivity may be higher than about 4. In the exemplary embodiments wherein spacer layer 30 comprises an oxide, while protection layer comprises a nitride, the etchant may include $CF_4$, $Cl_2$, $CH_4$, $N_2$, $O_2$, $H_2$, $C_xF_y$, or other carbon and fluorine containing gas. In the embodiments wherein spacer layer 30 comprises a nitride, while protection layer comprises an oxide, the etchant may also include $CF_4$, $Cl_2$, $CH_4$, $N_2$, $O_2$, $H_2$, $C_xF_y$, or other carbon and fluorine containing gas. In the embodiments wherein protection layer 32 comprises a CN-containing polymer, the etchant may include $CF_4$, $Cl_2$, $CH_4$, $N_2$, $O_2$, $H_2$, $C_xF_y$. In the embodiments wherein protection layer 32 comprises a CF-containing polymer, the etchant may include $CF_4$, $Cl_2$, $CH_4$, $N_2$, $O_2$, $H_2$, $C_xF_y$.

During the patterning of spacer layer 30, protection layer 32 protects the sidewalls portions of spacer layer 30. As a result, the outer edges of the resulting spacers 34 are substantially vertical, and spacers 34 have a rectangular shape in the cross-sectional view. As a comparison, if protection layer 32 is not adopted, the outer sidewalls of the resulting spacers will be more curved, with the upper portions increasing narrower than lower portions. The rectangular-shaped spacers 34 have a substantially uniform width from top to bottom (with protection layer 32 has a thickness much smaller than the thickness of spacer layer 30).

Figure 6:
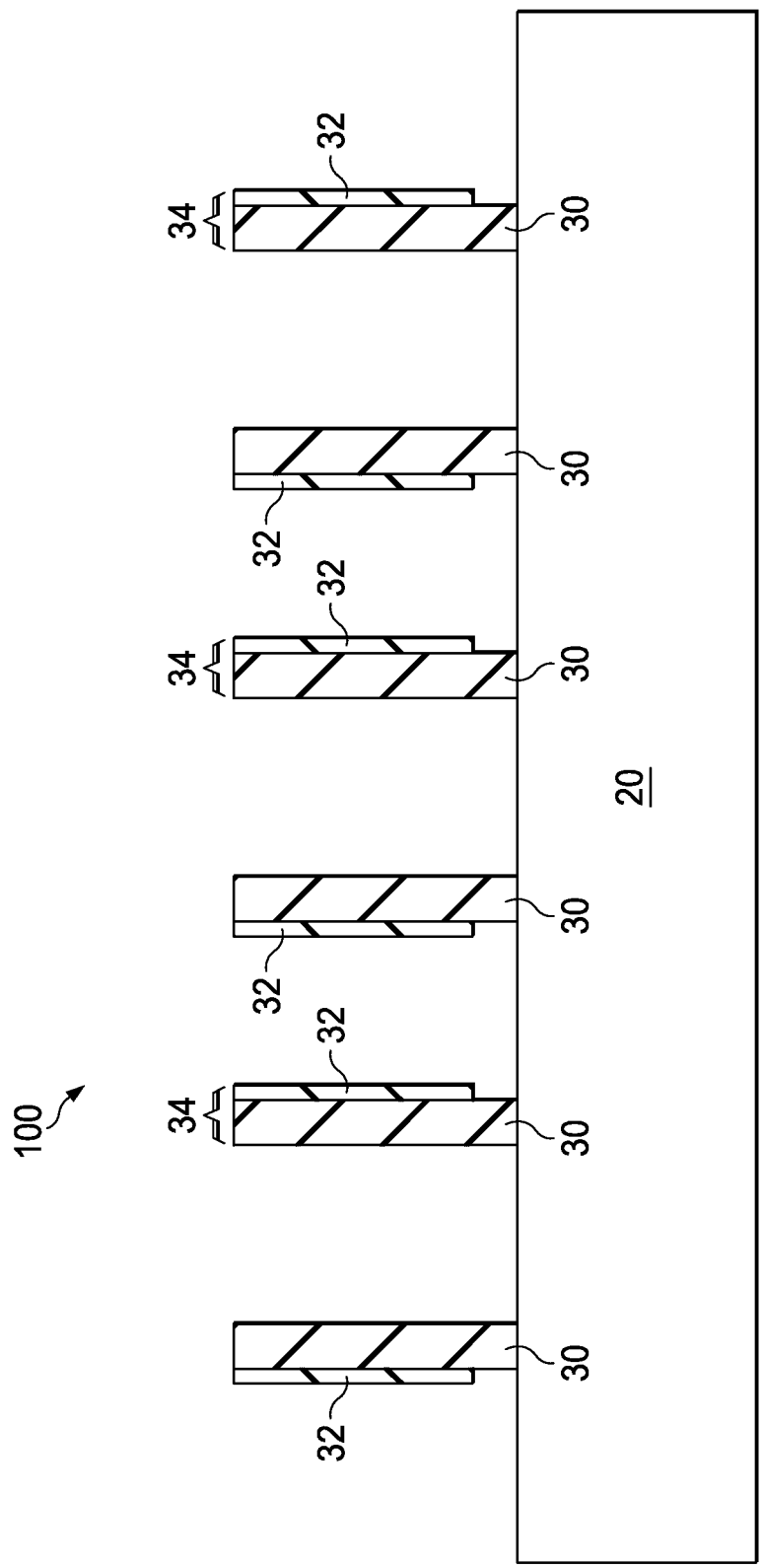

In some embodiments, for example, when patterned features 24 are mandrels (sacrificial patterns formed for forming spacers 34), patterned features 24 are removed, leaving spacers 34. FIG. 6 illustrates the resulting structure. Hence, the average pitch of spacers 34 is as small as a half of the pitch of patterned features 24. Through the using of mandrels to form spacers, the pitch of spacers 34 may be reduced to values smaller than what the photolithography process can achieve.

FIG. 7 illustrates the etching of base layer 20 using spacers 34 as an etching mask, so that recesses 36 are formed to extend from the top surface of base layer 20 into base layer 20. In these embodiments, base layer 20 may be a dielectric layer, a silicon substrate, or the like. Next, as shown in FIG. 8, features 38, which are formed of a material different from the material of base layer 20, are formed to fill the recesses 36 in FIG. 7. Features 38 are formed of a material different from the material of base layer 20. For example, when base layer 20 is a semiconductor substrate, features 38 may be dielectric features. When base layer 20 is a dielectric layer such as a low-k dielectric layer, features 38 may be metal lines such as copper lines. Spacers 34 shown in FIG. 7 are removed, as shown in FIG. 8.

Figure 9:
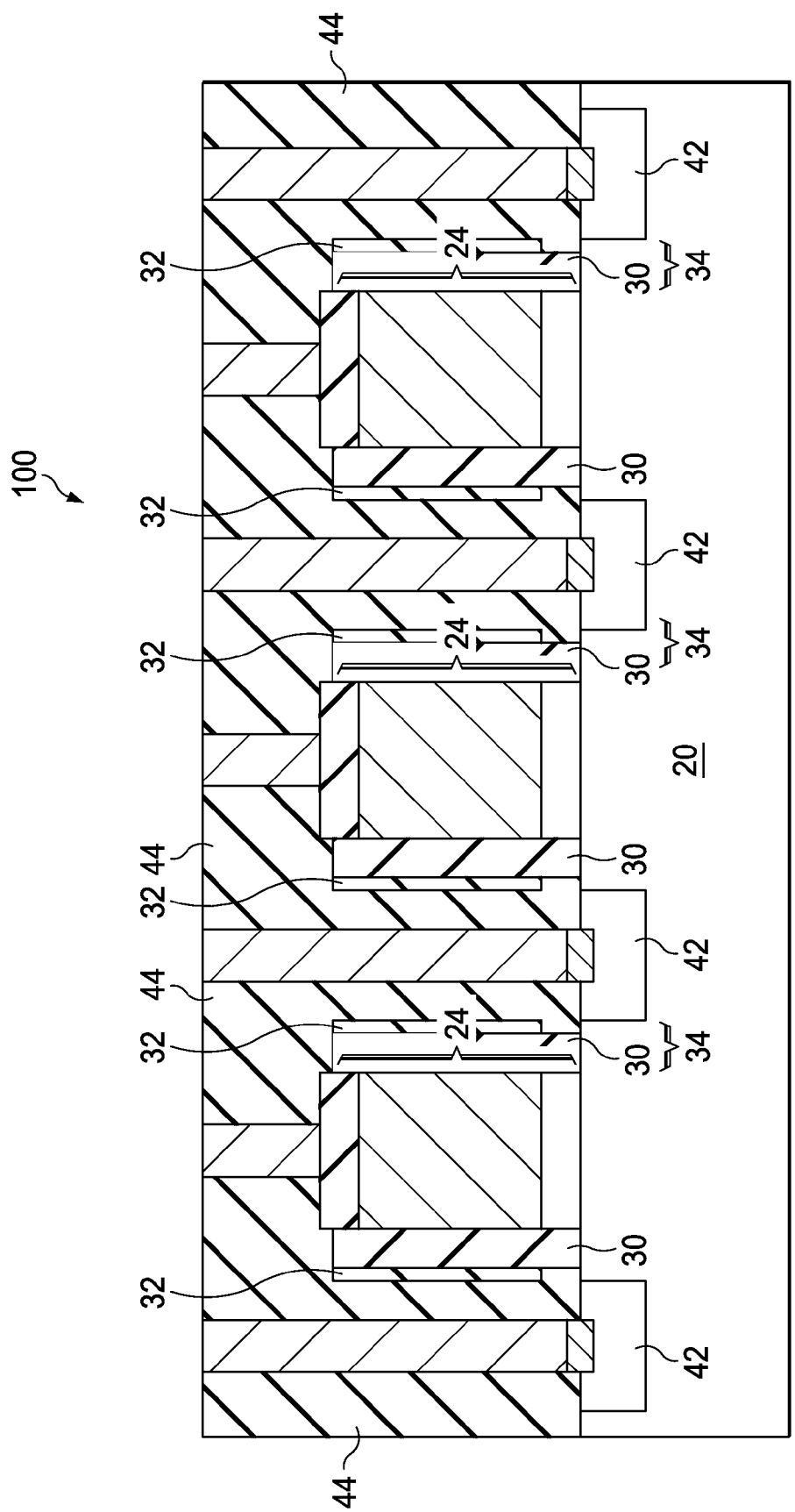
FIG. 9 illustrates a cross-sectional view of a transistor in accordance with some exemplary embodiments, wherein the transistor has gate spacers with rectangular cross-sectional view shapes.

FIG. 9 illustrates the cross-sectional view of an integrated circuit structure in accordance with alternative embodiments, in which patterned features 24 are gate stacks including gate dielectrics 26 and gate electrodes 28. In these embodiments, spacers 34 are the gate spacers of the resulting transistors 40, which further includes source and drain regions 42 in base layer 20, which is a semiconductor substrate. In the resulting structure, gate spacers 34 include the remaining spacer layers 30 as inner portions, which is homogenous. Protection layer 32 forms the outer portions of gate spacers 34, with each of spacer layers 30 having an inner edge contacting an edge of gate electrode 28, and an outer edge contacting protection layer 32. Protection layer 32 does not have any horizontal portion in the exemplary embodiments.

FIG. 9 also illustrates dielectric layer 44, which may include Contact Etch Stop Layer (CESL) and Inter-Layer Dielectric (ILD) over the CESL. Dielectric layer 44 may be formed of a material different from the material of protection layer 32. For example, dielectric layer 44 may comprise Phospho-Silicate glass (PSG), Boro-Silicate Glass (BSG), Boron-Doped Phospho-Silicate Glass (BPSG), Tetraethyl Orthosilicate (TEOS) oxide, TiN, SiOC, or other applicable materials. The bottom surfaces of protection layer 32 are higher than, and spaced apart from, the top surface of substrate 20 (and/or source/drain regions 42), with dielectric layer 44 separating the bottom surfaces of protection layers 32 from substrate 20 (and/or source/drain regions 42).

Protection layer 32 forms a vertical thin film that is between spacer layer 30 and dielectric layer 44. From the top end to the bottom end, the thickness of protection layer 32 may be substantially uniform. For example, the lower 90 percent of protection layer 32 has a uniform thickness that has a fluctuation smaller than about 5 percent.

The embodiments of the present disclosure have some advantageous features. By forming protection layer 32 and removing the vertical portions of protection layer 32, spacers 30 may be formed to have a vertical profile. For example, when transferring the patterns of the spacers down to an underlying layer, with the spacers having a rectangular profile, the widths of the underlying features, whose patterned are defined by the spacers, are more uniform.

In accordance with some embodiments, a method includes forming a spacer layer on a top surface and sidewalls of a patterned feature, wherein the patterned feature is overlying a base layer. A protection layer is formed to contact a top surface and a sidewall surface of the spacer layer. The horizontal portions of the protection layer are removed, wherein vertical portions of the protect layer remain after the removal. The spacer layer is etched to remove horizontal portions of the spacer layer, wherein vertical portions of the spacer layer remain to form parts of spacers.

In accordance with other embodiments, a method includes forming a spacer layer on a top surface and sidewalls of a patterned feature, wherein the patterned feature is overlying a base layer, and reacting a surface layer of the spacer layer with a process gas to generate a protection layer. A bottom layer of the spacer layer remains un-reacted with the process gas. Horizontal portions of the protection layer are removed using a first etchant gas, wherein vertical portions of the protect layer remain after the removing. The spacer layer is then etched to remove horizontal portions of the spacer layer using a second etchant gas different from the first etchant gas, wherein vertical portions of the spacer layer remain to form parts of spacers.

In accordance with yet other embodiments, a device includes a semiconductor substrate, a gate stack over the semiconductor substrate, and a gate spacer on a sidewall of the gate stack. The gate stack includes an inner portion having an inner sidewall contacting a sidewall of the gate stack, and an outer portion comprising an inner edge contacting an outer edge of the inner portion. The inner portion and the outer portion include different materials. The out portion has a substantially uniform thickness, and has a bottom surface over and spaced apart from the semiconductor substrate. The device further includes a source/drain region adjacent to the gate spacer.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
    forming a spacer layer on a first top surface and sidewalls of a patterned feature, wherein the patterned feature is overlying a base layer, wherein the spacer layer comprises first horizontal portions directly on the base layer, and the first horizontal portions cover an entire top surface of the base layer, with the entire top surface being between the patterned feature and a neighboring patterned feature;
    forming a protection layer contacting a second top surface and a sidewall surface of the spacer layer, wherein the protection layer comprises second horizontal portions over the first horizontal portions;
    removing the second horizontal portions of the protection layer, wherein vertical portions of the protection layer remain after the removing;
    etching the spacer layer using the remaining vertical portions of the protection layer as an etching mask to remove all horizontal portions of the spacer layer, wherein the vertical portions of the spacer layer and the remaining vertical portions of the protection layer remain to form spacers;
    after the etching the spacer layer, removing the patterned feature;
    etching the base layer and the vertical portions of the protection layer to form a trench in the base layer, wherein the spacers are used as an etching mask;
    filling the trench with a metal; and
    removing the spacers.

2. The method of claim 1, wherein the forming the protection layer comprises performing a nitridation to convert a surface layer of the spacer layer into the protection layer, wherein a top surface of a horizontal portion of the spacer layer is nitridated as a horizontal portion of the protection layer.

3. The method of claim 1, wherein the forming the protection layer comprises performing an oxidation to convert a surface layer of the spacer layer into the protection layer.

4. The method of claim 1, wherein the forming the protection layer comprises depositing the protection layer over the spacer layer, and wherein a process gas for the depositing comprises $CH_4$ and $N_2$.

5. The method of claim 1, wherein the forming the protection layer comprises depositing the protection layer over the spacer layer, and wherein a process gas for the depositing comprises $CH_2F_2$.

6. The method of claim 1, wherein the patterned feature comprises a gate dielectric and a gate electrode over the gate dielectric, and wherein the base layer comprises a semiconductor substrate.

7. A method comprising:
    forming a spacer layer comprising:
        a top portion on a top surface of a first and a second patterned feature;
        vertical portions on opposite sidewalls of the first and the second patterned features; and
        first horizontal portions with bottom surfaces contacting top surface of a base layer, wherein the first horizontal portions extend from the first patterned feature to the second patterned feature;
    performing a nitridation or an oxidation to convert a surface layer of the spacer layer into a protection layer, wherein a bottom layer of the spacer layer remains after the nitridation or the oxidation;
    performing an anisotropic etching to remove a horizontal portion of the protection layer, wherein vertical portions of the protection layer remains on sidewalls of remaining portions of the vertical portions of the spacer layer; and
    removing a portion of the bottom layer in the top portion of the spacer layer using the vertical portions of the protection layer as an etching mask, wherein remaining portions of the vertical portions of the spacer layer and the vertical portions of the protection layer remain as masks;
    removing the first and the second patterned features;
    etching the base layer using the masks as an etching mask; and
    removing the remaining portions of the vertical portions of the spacer layer and the vertical portions of the protection layer.

8. The method of claim 7, wherein after the top portion of the spacer layer is removed, the spacer layer does not have any portion overlapped by the vertical portions of the protection layer, with vertical portions of the spacer layer remaining, wherein the vertical portions of the protection layer have bottom surfaces higher than bottom surfaces of the remaining vertical portions of the spacer layer.

9. The method of claim 7, wherein the etching the base layer generates recesses in the base layer.

10. The method of claim 9 further comprising filling the recesses with a metallic material.

11. The method of claim 7, wherein the anisotropic etching is performed using a first etchant gas, and the removing the top portion of the spacer layer is performed using a second etchant gas different from the first etchant gas.

12. The method of claim 7, wherein the nitridation or the oxidation comprises an oxidation.

13. The method of claim 10 further comprising filling entireties of the recesses with conductive materials.

* * * * *